United States Patent
Harris et al.

(10) Patent No.: US 7,646,576 B2
(45) Date of Patent: Jan. 12, 2010

(54) APPARATUS AND METHOD FOR HIGH-VOLTAGE TRANSIENT BLOCKING USING LOW VOLTAGE ELEMENTS

(75) Inventors: Richard A. Harris, Palo Alto, CA (US); Francois Hebert, San Mateo, CA (US)

(73) Assignee: Bourns, Inc., Riverside, CA (US)

( * ) Notice: Subject to any disclaimer, the term of this patent is extended or adjusted under 35 U.S.C. 154(b) by 235 days.

(21) Appl. No.: 11/271,059

(22) Filed: Nov. 9, 2005

(65) Prior Publication Data

US 2006/0098365 A1    May 11, 2006

Related U.S. Application Data (60) Provisional application No. 60/626,308, filed on Nov. 9, 2004.

(51) Int. Cl.
  H02H 3/20    (2006.01)
  H02H 9/04    (2006.01)
(52) U.S. Cl. .................. 361/111; 361/56; 361/91.1
(58) Field of Classification Search .................. 361/58, 361/87, 93.9, 56, 111, 91.1
  See application file for complete search history.

(56) References Cited

U.S. PATENT DOCUMENTS

| | | | | |
|---|---|---|---|---|
| 3,916,220 A | | 10/1975 | Roveti | 307/251 |
| 4,053,915 A | * | 10/1977 | Cave | 257/271 |
| 4,533,970 A | * | 8/1985 | Brown | 361/58 |
| 5,130,262 A | | 7/1992 | Masquelier et al. | 437/31 |
| 5,319,515 A | | 6/1994 | Pryor et al. | 361/93 |
| 5,625,519 A | | 4/1997 | Atkins | 361/93 |
| 5,696,659 A | | 12/1997 | Maruo | 361/93 |
| 5,729,418 A | | 3/1998 | Lei | 361/58 |
| 5,742,463 A | | 4/1998 | Harris | 361/88 |
| 5,789,900 A | | 8/1998 | Hasegawa et al. | 320/132 |
| 5,929,665 A | | 7/1999 | Ichikawa et al. | 327/109 |
| 6,002,566 A | | 12/1999 | Arikawa et al. | 361/93.1 |
| 6,118,641 A | * | 9/2000 | Atkins et al. | 361/58 |
| 6,157,529 A | | 12/2000 | Ahuja | 361/111 |
| 6,313,610 B1 | | 11/2001 | Korsunsky | 320/134 |
| 6,331,763 B1 | | 12/2001 | Thomas et al. | 320/136 |
| 6,351,360 B1 | | 2/2002 | Kotowski et al. | 361/103 |
| 6,518,731 B2 | | 2/2003 | Thomas et al. | 320/136 |
| 6,714,393 B2 | | 3/2004 | Nostrand | 361/58 |

(Continued)

FOREIGN PATENT DOCUMENTS

AU    A-75035/91    11/1991

(Continued)

*Primary Examiner*—Stephen W Jackson
*Assistant Examiner*—Zeev Kitov
(74) *Attorney, Agent, or Firm*—Lumen Patent Firm (57) ABSTRACT

An apparatus and method for high-voltage transient blocking employing a transient blocking unit (TBU) that has at least one depletion mode n-channel device interconnected with at least one depletion mode p-channel device such that a transient alters a bias voltage $V_p$ of the p-channel device and a bias voltage $V_n$ of the n-channel device in concert. Specifically, the bias voltages are altered such that the p-channel device and n-channel device mutually switch off to block the transient. The depletion mode n-channel device employs a set of cascaded low-voltage depletion mode field effect transistors (FETs) such as metal-oxide-silicon field effect transistors (MOSFETs) connected source-to-drain to achieve the desired high-voltage operation of the TBU.

15 Claims, 5 Drawing Sheets

U.S. PATENT DOCUMENTS

| | | | |
|---|---|---|---|
| 6,768,623 B1 | 7/2004 | Shen | 361/93.9 |
| 6,855,988 B2 | 2/2005 | Madurawe | 257/347 |
| 6,861,828 B2 | 3/2005 | Watanabe | 323/282 |
| 6,865,063 B2 | 3/2005 | Ball | 361/93.9 |
| 6,914,416 B2 | 7/2005 | Thomas et al. | 320/136 |
| 6,948,078 B2 | 9/2005 | Odaohhara | 713/300 |
| 6,958,591 B1 | 10/2005 | Smith | 320/163 |
| 6,970,337 B2 | 11/2005 | Strahm | 361/58 |
| 7,283,406 B2 * | 10/2007 | Lu et al. | 365/189.09 |

FOREIGN PATENT DOCUMENTS

| | | |
|---|---|---|
| DE | 3805811 | 9/1988 |
| DE | 4022253 | 1/1992 |
| DE | 4402461 | 8/1995 |
| DE | 4494617 | 11/1996 |
| EP | 0818867 | 1/1998 |
| EP | 0862255 | 2/1998 |
| GB | 2294598 | 1/1995 |
| JP | 1991053613 | 7/1991 |
| WO | WO9501667 | 1/1995 |
| WO | WO01/01539 | 1/2001 |
| WO | WO03069753 | 8/2003 |
| WO | WO2004006408 | 1/2004 |
| WO | WO2004034544 | 4/2004 |

* cited by examiner

APPARATUS AND METHOD FOR HIGH-VOLTAGE TRANSIENT BLOCKING USING LOW VOLTAGE ELEMENTS

RELATED APPLICATIONS

The present application claims priority from provisional U.S. application 60/626,308 that was filed on 9 Nov. 2004 and is herein incorporated in its entirety.

FIELD OF THE INVENTION

This invention relates generally to apparatus and methods that employ a transient blocking unit (TBU) that uses a set of cascaded low-voltage elements to achieve high-voltage capability and thereby improve performance.

BACKGROUND ART

Many circuits, networks, electrical devices and data handling systems are operated in configurations and environments where external factors can impair their performance, cause failure or even result in permanent damage. Among the most common of these factors are over-voltage and over-current. Protection against these factors is important and has been addressed in the prior art in a number of ways, depending on the specific electronics and their application.

Fuses that employ thermal or magnetic elements are one common protection measure. In other cases, protection circuits are available. Some examples are described in U.S. Pat. Nos. 5,130,262; 5,625,519; 6,157,529; 6,828,842 and 6,898,060. Protection circuits are further specialized depending on conditions and application. For example, in the case of protecting batteries or rechargeable elements from overcharging and over-discharging one can refer to circuit solutions described in U.S. Pat. Nos. 5,789,900; 6,313,610; 6,331,763; 6,518,731; 6,914,416; 6,948,078; 6,958,591 and U.S. Published Application 2001/00210192. Still other protection circuits, e.g., ones associated with power converters for IC circuits and devices that need to control device parameters and electric parameters simultaneously also use these elements. Examples can be found in U.S. Pat. Nos. 5,929,665; 6,768,623; 6,855,988; 6,861,828.

When providing protection for very sensitive circuits, such as those encountered in telecommunications the performance parameters of the fuses and protection circuits are frequently insufficient. A prior art solution embodied by transient blocking units (TBUs) that satisfy a number of the constraints is taught in international publications PCT/AU94/00358; PCT/AU04/00117; PCT/AU03/00175; PCT/AU03/00848 as well as U.S. Pat. Nos. 4,533,970; 5,742,463 and related literature cited in these references.

Unfortunately, when high-voltage operation is required, traditional TBUs are frequently not an option because they require expensive, high-performance parts. Thus, it would be an advance in the art to reduce the expense while preserving or improving the high-voltage performance of TBUs.

OBJECTS AND ADVANTAGES

In view of the above prior art limitations, it is an object of the invention to provide an apparatus and method to permit high-voltage transient blocking using inexpensive low-voltage elements. In particular, it is an object of the invention to allow the use of inexpensive, low-voltage MOSFETs to build high-voltage transient blocking units (TBUs).

It is another object of the invention to ensure that the apparatus is easy to make, low-cost and highly integrable, e.g., on the same die.

These and other objects and advantages of the invention will become apparent from the ensuing description.

SUMMARY OF THE INVENTION

The objects and advantages of the invention are addressed by an apparatus for high-voltage transient blocking employing a transient blocking unit (TBU). The TBU has at least one depletion mode n-channel device interconnected with at least one depletion mode p-channel device. The interconnection is performed such that a transient alters a bias voltage $V_p$ of the p-channel device and a bias voltage $V_n$ of the n-channel device in concert. Specifically, the bias voltages are altered such that the p-channel device and n-channel device mutually switch off to block the transient. In accordance with the invention, at least one of the depletion mode n-channel device and the depletion mode p-channel device employs a set of cascaded low-voltage depletion mode field effect transistors (FETs) connected source-to-drain.

Most commonly, it is the depletion mode n-channel device that employs a set of at least two cascaded low-voltage depletion mode FETs. Preferably, the set includes two low-voltage metal-oxide-silicon field effect transistors (MOSFETs) or junction-gate FETs also known as JFETs. Other types of FETs can also be used, as will be appreciated by those skilled in the art.

The set also has an arrangement for providing a bias to a gate of a first of the two MOSFETs. The arrangement has a resistor R and diode D selected such that a drain-to-source voltage $V_{dsT2}$ on the second of the two MOSFETs, a diode voltage $V_{dbD}$ across the diode D and a current $I_R$ flowing through the resistor R obey the relationship:

$$V_{dsT2} = -V_{gsT2} + V_{dbD} + I_R \cdot R,$$

where $V_{gsT2}$ is a gate-to-source voltage on the second MOSFET. The diode is preferably an avalanche diode.

It is also preferable that the two MOSFETs have equal pinch-off voltages. In one specific embodiment the MOSFETs are stacked. In other words they are implemented in a merged structure with a top MOSFET stacked on a bottom MOSFET.

In accordance with a method of the invention, the TBU is interconnected as described above and it employs a set of cascaded low-voltage depletion mode FETs to achieve high-voltage transient blocking. The set is employed as the depletion mode n-channel device and is preferably made up of two low-voltage MOSFETs that have equal pinch-off or switch-off voltages. Furthermore, the low-voltage MOSFETs are preferably stacked on top of each other.

A bias is provided to the gate of the first MOSFET with the aid of an appropriate arrangement. The arrangement has resistor R and diode D chosen such that the drain-to-source voltage $V_{dsT2}$ on the second MOSFET, diode voltage $V_{dbD}$ across the diode D and current $I_R$ flowing through resistor R obey the relationship:

$$V_{dsT2} = -V_{gsT2} + V_{dbD} + I_R \cdot R,$$

where $V_{gsT2}$ is a gate-to-source voltage on the second MOSFET.

A detailed description of the preferred embodiments of the invention is presented below in reference to the appended drawing figures.

DETAILED DESCRIPTION

Figure 1:
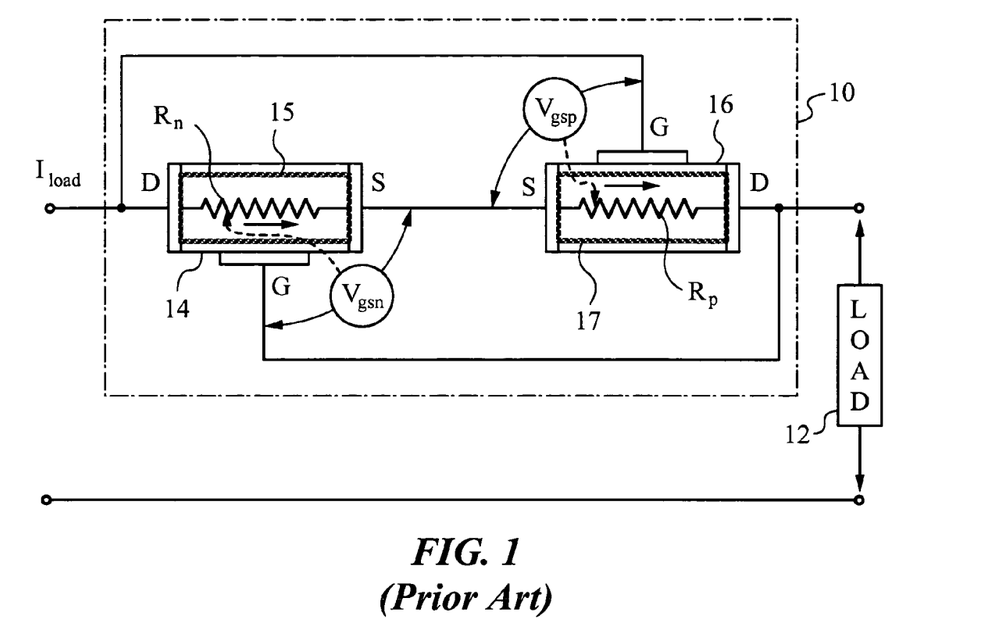
FIG. 1 is a diagram illustrating the basic principle of operation of a prior art uni-directional transient blocking unit (TBU).

The present invention and its principles will be best understood by first reviewing prior art uni-directional and bi-directional transient blocking units (TBUs) designed for over-voltage and over-current protection. The diagram in FIG. 1 shows a prior art TBU 10 for protecting a load 12 from voltage and/or current transients of one polarity, i.e., positive voltage spikes or surges. For this reason, TBU 10 is called uni-directional. TBU 10 uses a depletion mode n-channel device 14, typically an n-channel metal-oxide-silicon (NMOS) device implemented as a field effect transistor (FET). TBU 10 also uses a depletion mode p-channel device 16, typically a p-channel junction gate field effect-transistor (PJFET). It should be noted that PMOS, NJFET devices can also be used as devices 14, 16. In the example shown, both NMOS and PJFET 14, 16 are interconnected to take advantage of their n-channel and p-channel biasing and resistance properties to cause mutual switch off to block the transient.

More specifically, NMOS and PJFET 14, 16 have corresponding n-and p-channels 15, 17 as well as gate G, source S and drain D terminals. Resistances $R_n$, $R_p$ of NMOS and PJFET 14, 16 are low when voltage differences or bias voltages $V_{gsn}$ and $V_{gsp}$ between their gate G and source S terminals are zero. Normally, TBU 10 is unblocked and both NMOS and PJFET 14, 16 act as small resistors that allow a load current $I_{load}$ to pass to load 12. Application of negative bias $V_{gsn}$ to NMOS 14 and positive bias $V_{gsp}$ to PJFET 16 increases resistances $R_n$, $R_p$, as indicated by the arrows and turns NMOS and PJFET 14, 16 off. The interconnection of NMOS 14 with PJFET 16 source-to-source and gate-to-drain reinforces the biasing off process in response to excessive current from or associated with a transient. Specifically, as load current $I_{load}$ increases PJFET 16 develops a larger voltage drop across it, thus increasing negative bias $V_{gsn}$ applied to NMOS 14 and consequently increasing resistance $R_n$. Higher resistance $R_n$ increases positive bias $V_{gsp}$ on PJFET 16 thereby increasing $R_p$. Thus, the transient alters bias voltages $V_{gsn}$ and $V_{gsp}$ in concert such that NMOS and PJFET 14, 16 mutually increase their resistances $R_n$, $R_p$ and switch off and thus TBU 10 blocks the transient.

Figure 2:
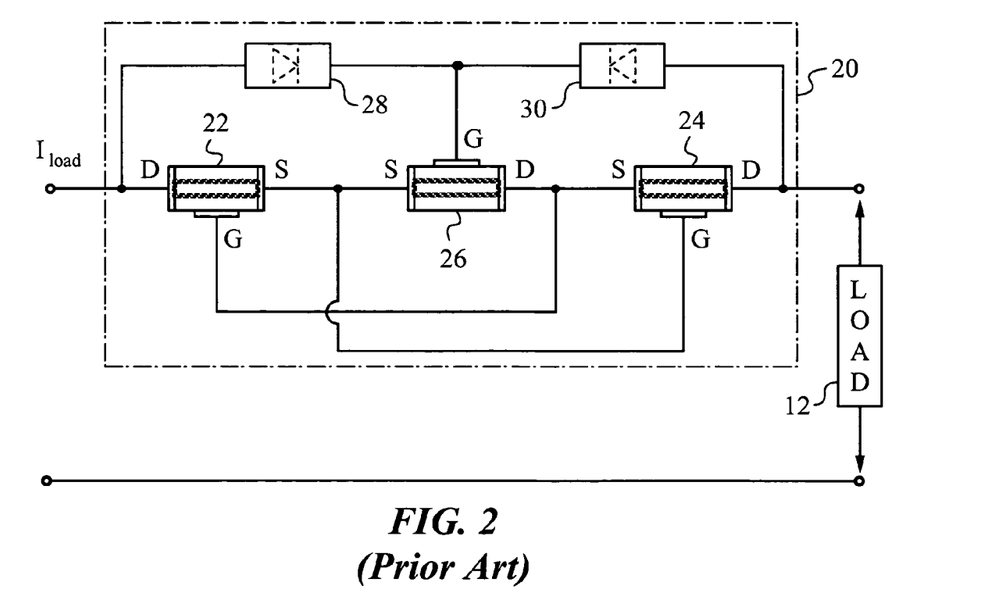
FIG. 2 is a diagram illustrating the basic principle of operation of a prior art bi-directional TBU.

The above principle of interconnection of n- and p-channel devices to achieve mutual switch off (sometimes also referred to as mutual pinch-off) is extended to bi-directional TBUs by using two uni-directional TBUs with one configured in reverse to block negative spikes. A simpler, bi-directional TBU 20 that protects load 12 from negative and positive spikes, is shown in FIG. 2. TBU 20 has two n-channel devices 22, 24 and one p-channel device 26. Devices 22, 24, 26 are interconnected between their gate G, source S and drain D terminals as shown. Two current limiters 28, 30 are used to ensure appropriate routing of current between devices 22, 24, 26. It should be noted that current limiters 28, 30 can be implemented by diodes, transistors, current sources or combinations thereof. TBU 20 causes mutual switch off of devices 22, 24, 26 in response to a negative or positive spike by employing the principles of controlling resistances by biasing in response to transients as explained above.

In fact, the prior art teaches a number of variants of TBUs based on the above principles. These include, among other, TBUs that use p-channel devices at inputs, a larger number of n-channel or p-channel devices as well as TBUs that employ high-voltage depletion devices. More detailed information about prior art TBUs and associated applications and methods can be found in published literature including, in particular, PCT/AU94/00358, PCT/AU04/00117; PCT/AU03/00175; PCT/AU03/00848 and U.S. Pat. No. 5,742,463 that are herein incorporated by reference.

Figure 3:
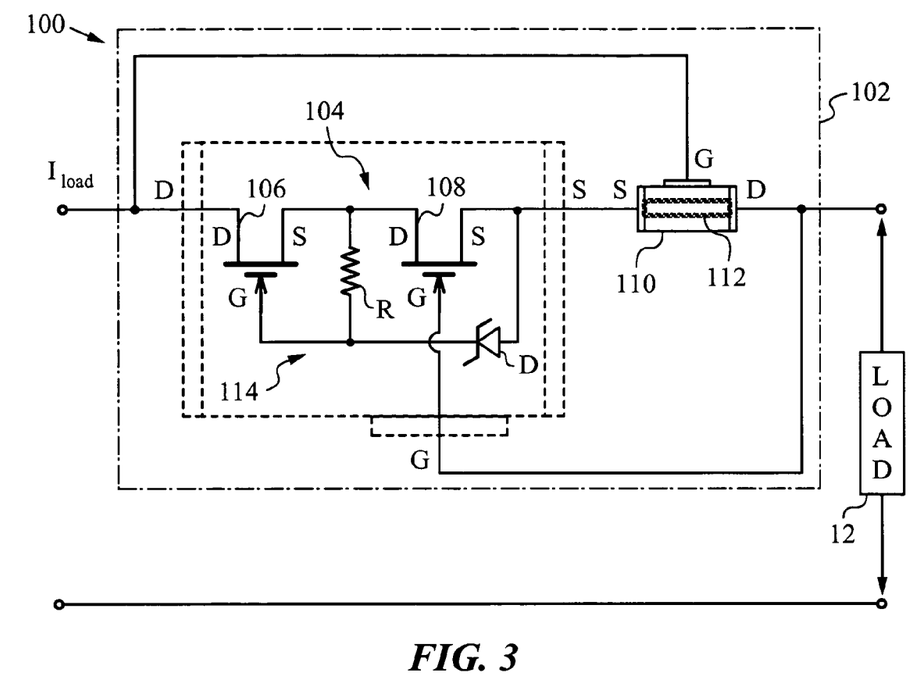
FIG. 3 is a diagram of a high-voltage transient blocking apparatus according to the invention employing a uni-directional TBU.

In accordance with the invention, high-voltage capability in transient blocking is achieved by an apparatus 100, as shown in FIG. 3. Apparatus 100 uses a uni-directional TBU 102 in which the depletion mode n-channel device is no longer a single enhancement mode n-channel FET, but rather a set 104 of two cascaded low-voltage depletion mode n-channel field effect transistors (FETs) 106, 108 connected source-to-drain. Preferably, low-voltage FETs 106, 108 are MOSFETs. TBU 102 also has a depletion mode p-channel device 110, in the form of a PJFET with a p-channel 112. The interconnections between PJFET 110 and set 104 of cascaded MOSFETs 106, 108 are source-to-source and gate-to-drain to retain the switch-off characteristics of standard TBU.

Set 104 has an arrangement 114 for providing a bias to gate G terminal of first MOSFET 106. Arrangement 114 has a resistor R and a diode D selected such that a drain-to-source voltage $V_{dsT2}$ on second MOSFET 108, a diode voltage $V_{dbD}$ across diode D and a current $I_R$ flowing through resistor R obey the relationship:

$$V_{dsT2} = -V_{gsT2} + V_{dbD} + I_R \cdot R,$$

where $V_{gsT2}$ is a gate-to-source voltage on second MOSFET 108. The diode is preferably an avalanche diode.

In some embodiments MOSFETs 106, 108 have equal pinch-off or switch-off voltages. This may be most practical when MOSFETs 106, 108 come from the same wafer and thus can be made in higher volume. It should be noted, however, that set 104 can just as well us cascaded MOSFETs 106, 108 that have vastly different pinch-off voltages. Such situation only requires adjustment of the breakdown voltage of avalanche diode D.

During operation, TBU 102 of apparatus 100 achieves high-voltage transient blocking of positive surges (over-current or over-voltage). That is because set 104 of low-voltage MOSFETs 106, 108 employed as the depletion mode n-channel device behaves like a high-voltage n-channel device sufficiently well for the purposes of TBU 102. In particular, TBU 102 current leakage requirements are not stringent, and thus permit cascaded set 104 of low-voltage MOSFETs 106, 108.

That is because despite their considerable current leakage, on the order of milliamps in the off state, cascaded MOSFETs 106, 108 can block large voltages. As a result, set 104 of cascaded MOSFETs 106, 108 operates as an effective single cascade transistor with source terminal S of MOSFET 108 acting as the source of entire set 104 and gate terminal G of MOSFET 108 acting as the gate of entire set 104. A critical condition of operation is that the avalanche voltage of diode D be less than the breakdown voltage of MOSFET 108.

MOSFET 108 is controlled by bias voltage $V_{gsT2}$ applied to its gate terminal G. If, during operation the drain-to-source voltage $V_{dsT2}$ across second MOSFET 108 rises to a point where diode D begins to conduct through resistor R, then a voltage will be generated across R. This voltage will provide a bias voltage to gate terminal G of first MOSFET 106. This bias voltage will effectively hold the voltage at source terminal S of first MOSFET 106 in accordance with the following relationships:

$$V_{dsT2} = -V_{gsT2} + V_{dbD} + I_R \cdot R, \text{ as}$$

$$I_R \cdot R < V_{poT2}; \text{ and } V_{gsT2} < V_{poT2}, \text{ then}$$

$$V_{dsT2} < -V_{poT2} + V_{dbD} + V_{poT1},$$

where the subscript po denotes pinch-off and subscripts T1, T2 stand for first and second MOSFETs 106, 108, respectively. Now, if both MOSFETs 106, 108 have the same pinch-off voltage, as is reasonable if both FETs are of the same design, then:

$$V_{dsT2} < V_{dbD}.$$

Therefore, as long as $V_{dbD}$ of diode D is selected correctly, then arrangement 114 will ensure that $V_{dsT2}$ across second MOSFET 108 never exceeds the breakdown voltage of second MOSFET 108. Therefore, the total breakdown strength of the cascade of set 104 is the breakdown strength of first MOSFET 106 plus $V_{dbD}$ of diode D. As such, set 104 operates as a single 3 terminal device with characteristics equivalent to those of second MOSFET 108 except with improved breakdown voltage. In this manner, the advantage of high-voltage transient blocking operation of TBU 102 is secured with inexpensive, low-voltage MOSFETs 106, 108. This is also because the maximum gate voltage that can now be applied to PJFET 110 is higher. In addition, set 104 is easy to make, low-cost and highly integrable, since it is placed on the same die and simply replaces the former single depletion mode n-channel device.

Figure 4:
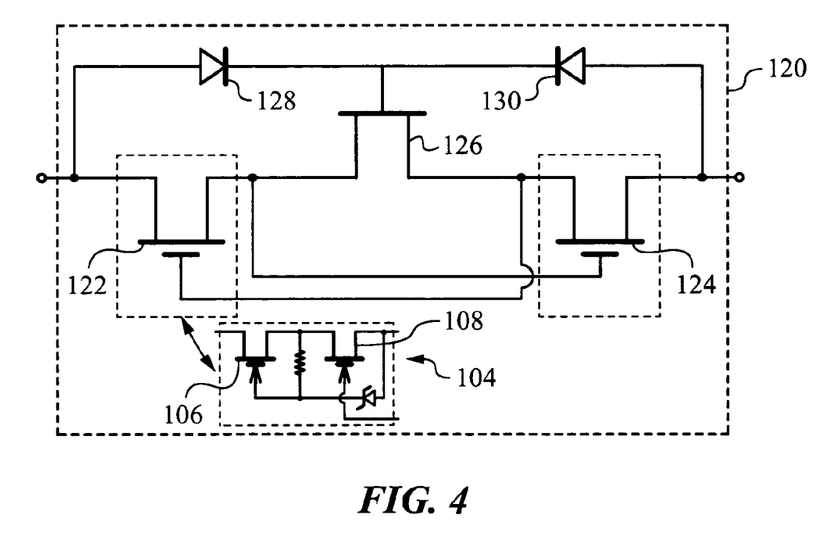
FIG. 4 is a diagram of illustrating a bi-directional TBU employing a set of cascaded MOSFETs according to the invention.

Now, set 104 can also be used in a bi-directional TBU 120, as illustrated in FIG. 4. TBU 120 has first and second depletion mode n-channel devices 122, 124, as well as a depletion mode p-channel device 126. Devices 122, 124, 126 are interconnected as described above to achieve switch-off to either positive or negative transients. TBU 120 also employs two current limiters 128, 138, here in the form of diodes, to ensure proper current flow.

In accordance with the invention, first depletion mode n-channel device 122 is replaced by set 104 of cascaded MOSFETs 106, 108 as indicated by the arrow. It should be noted that set 104 can also be used to replace second depletion mode n-channel device 124 if desired. The operation of TBU 120 is analogous to a prior art bi-directional TBU, except that it now has a high-voltage capability it did not possess before afforded by low-cost, low-voltage MOSFETS 106, 108.

Figure 5:
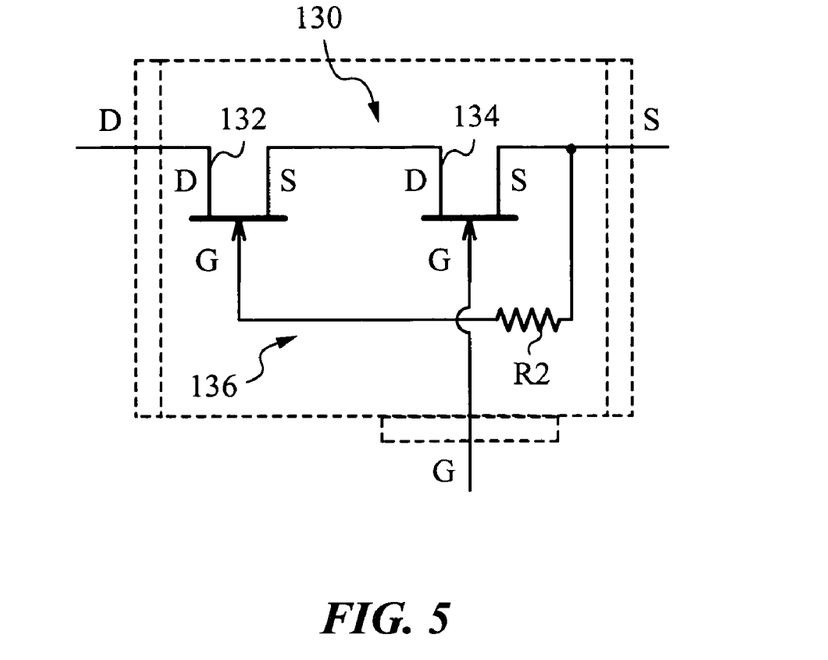
FIG. 5 is a diagram of an alternative set of cascaded low-voltage n-channel devices for use in any TBU in accordance with the invention.

FIG. 5 is a diagram of an alternative set 130 of two cascaded NMOS devices 132, 134 according to the invention that can be employed in the above uni-directional TBU 102 or bi-directional TBU 120, or still other uni- and bi-directional TBUs requiring low-cost, high-voltage operation. In contrast to the previous embodiment, a resistor R2 is used in place of the avalanche diode D in a bias arrangement 136. Also, the pinch-off of the second device 132 is raised to a level just below the breakdown voltage of first device 134. In this way the action of the avalanche diode D from the last embodiment, i.e., that of offsetting the gate drive of device 132 to a level that permits it to act only when the breakdown voltage of inner device 134 is approached, can be imitated and a cascade of low voltage devices can be used to make a device which performs as a high voltage device. Of course, set 130 can be used in any of the above TBUs or still other TBUs to replace one or more depletion mode n-channel devices.

Figure 6:
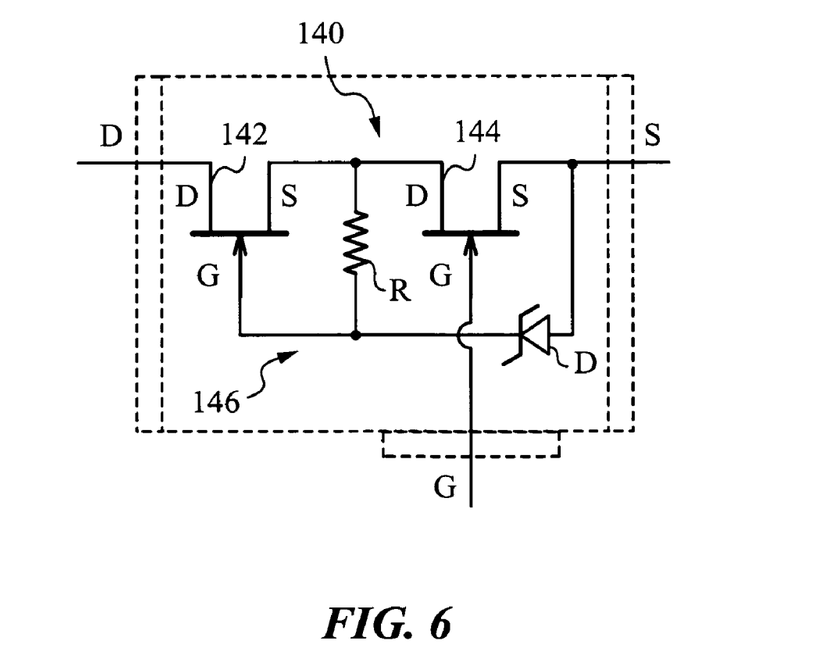
FIG. 6 is a diagram of still another alternative set of cascaded low-voltage NMOS devices for use in any TBU in accordance with the invention.

FIG. 6 is a diagram of still another alternative set 140, which uses first and second NMOS devices 142, 144 and a bias arrangement 146 that is analogous to bias arrangement 114. As before set 140 can be used in any TBU. It should also be understood, that the depletion mode n-channel device that employs a set of at least two cascaded low-voltage depletion mode FETs can take advantage of various specific types of FETs. This is true for any of the above embodiments. For example, the set can include low-voltage MOSFETs or junction-gate FETs also known as JFETs or still other of FETs, as will be appreciated by those skilled in the art.

Figure 7:
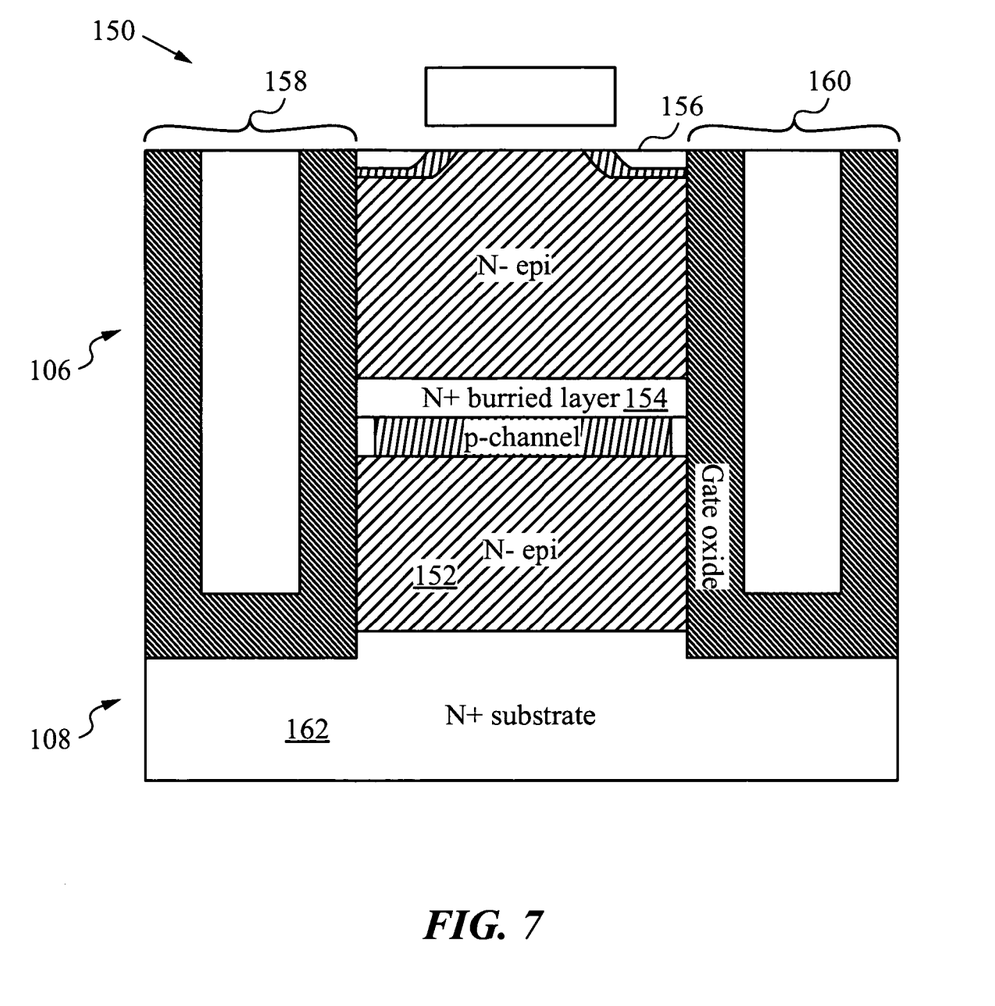
FIG. 7 illustrates an implementation of a set of two cascaded MOSFETs stacked on top of each other in a merged structure.

When implementing any of the above embodiments in practice, it is preferred, for reasons of size and efficiency to integrate sets of cascaded FETs. For example, as shown in FIG. 7, two MOSFETs 106, 108 of set 104 can be stacked on top of each other in a merged structure 150. First MOSFET 106 is the top MOSFET and it is stacked on second MOSFET 108, which becomes the bottom MOSFET.

Stacked device or merged structure 150, as shown in FIG. 7, is obtained through vertical integration of devices 106, 108. A bottom N-epi layer 152 is the outer high-voltage contact with the n+ connected to the input/output of the TBU. The p-channel of the device is the p-layer between the upper and lower N-epi layers. The source of the outer device or bottom device 108 is a N+ thin buried layer 154 which is also the drain contact of the top (inner part of the cascade) device 106. A top surface 156 is the standard source, channel and gate region of device 106.

Note that the channel region of outer device 108 can be formed from lateral trenches 158, 160. Lateral doping of the channel can be obtained by partially filling trenches 158, 160 on each side and applying lateral doping techniques such as, for example, tilted implants or vapor phase doping, or diffusion from solid or gas sources.

Top MOSFET 106 can have a low pinch-off voltage ($V_{po}$), by using special depletion implant in its gate oxide. The special implant can be Cs, K, Na or other implants familiar to those skilled in the art. The purpose of implantation is to add charge to the oxide. Other techniques involve using shallow N-type dopants to form a conductive channel in the silicon under the gate oxide, which can be depleted as the gate voltage becomes more and more negative (for an NMOS device).

Bottom MOSFET 108 has a very thick gate oxide, and uses an implanted dopant to form the conductive n-channel (at $V_{gs}=0V$). For example, the N-type dopant can be arsenic, phosphorus or antimony. The gate of bottom MOSFET 108 is connected with deep trenches 158, 160 that may have more than one level, and can be connected at different portions. Advantageously, bias arrangement 114 can be integrated in merged structure 150 by using the available doped junctions. Structure 150 can be made by using multiple epi depositions.

Stacked devices 106, 108 can be formed by a multiple growth on an N+ substrate 162. The layers and their associated parameters can chosen as follows:
1) N+ substrate;
2) N− epi 1 for outer high-voltage device thickness and doping dependent on breakdown voltage;
3) p-channel region (1-5 μm, P-type, $1\times10^{16}$ to $1\times10^{18}$ depending on pinch-off, punch-through and other requirements);
4) N+ source of bottom FET 108, between $1\times10^{17}$ to $1\times10^{19}$, 0.2 to 2 μm thick, N-type arsenic or antimony for low diffusion rate; and
5) N− epi 2 for inner high-voltage device.

Top processing is a standard VDMOS process, with a self-aligned channel formed by implanting and diffusion of boron after the poly gate is patterned. The channel of the outer (lower) FET 108 can be formed by filling to the trench to the top of the bottom epi. Then, the sidewall is doped to form the N− region on the desired side of the P-type channel epi layer. One then proceeds by:
1) growing or depositing the thick gate oxide of the outer (bottom) FET;
2) refilling with poly to protect that region;
3) etching the sidewall of the trench to form the gate of the bottom FET;
4) (optional) etchback of the poly up to the N+ buried layer of the top FET;
5) (optional) etch to remove the sidewall N-type doping;
6) oxidation of the trench sidewall again followed by filling of the trench.

Figure 8:
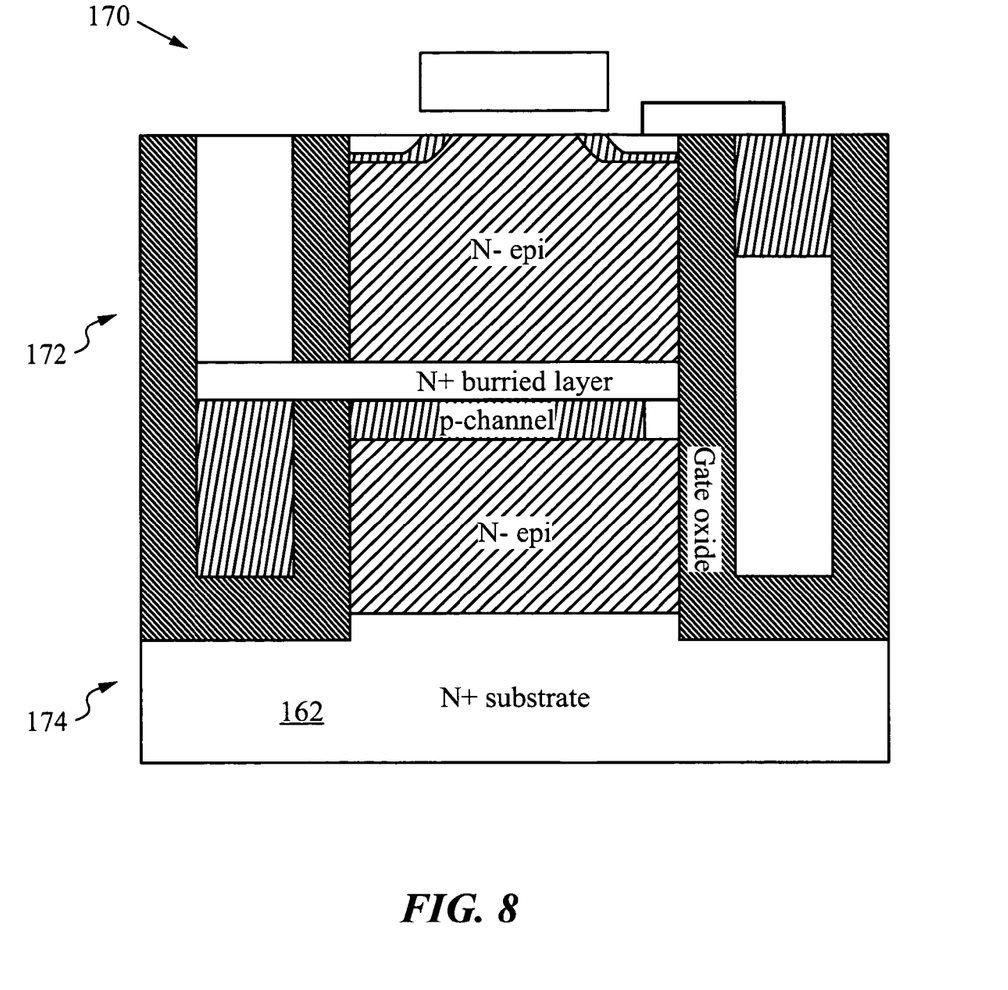
FIG. 8 illustrates another set of two cascaded FETs stacked on top of each other in a merged structure.

FIG. 8 illustrates another set of two cascaded FETs 172, 174 stacked on top of each other in a merged structure 170. Merged structure 170 has an integrated Schottky diode formed in the trench region surrounding the vertically arranged FETs 172, 174. FIG. 8 also shows that it is possible to terminate the partial fill of the trenches to have access to some of the layers grown in the epi "stack", as may be useful for integrating the various possible biasing arrangements into the set of cascaded FETs 172, 174. For example, a contact to the drain of the top NMOS can be made using a partial trench fill, sidewall etching and poly deposition to contact the desired layer.

Many other embodiments of the apparatus as well as the method are possible, as will be evident to those skilled in the art. Therefore, the scope of the invention should be judged by the appended claims and their legal equivalents.

We claim:

1. An apparatus for transient blocking comprising a transient blocking unit having at least one depletion mode n-channel 3-terminal network interconnected with at least one depletion mode p-channel 3-terminal network such that a transient alters a bias voltage $V_p$ of said depletion mode p-channel 3-terminal network and a bias voltage $V_n$ of said depletion mode n-channel 3-terminal network, whereby said depletion mode p-channel 3-terminal network and said depletion mode n-channel 3-terminal network mutually switch off to block said transient, and wherein at least one of said at least one depletion mode n-channel 3-terminal network and said at least one depletion mode p-channel 3-terminal network comprises a set of two or more low-voltage depletion mode field effect transistors connected in source-to-drain series.

2. The apparatus of claim 1, wherein said set is included in said depletion mode n-channel 3-terminal network.

3. The apparatus of claim 2, wherein said set comprises at least two low-voltage depletion mode devices selected from the group consisting of field effect transistors and junction gate field effect transistors.

4. The apparatus of claim 3, wherein said at least two low-voltage depletion mode devices comprise two low-voltage metal-oxide-silicon field effect transistors.

5. The apparatus of claim 4, wherein said set further comprises a means for providing a bias to a gate of a first of said two metal-oxide-silicon field effect transistors.

6. The apparatus of claim 5, wherein said means comprises an avalanche diode.

7. The apparatus of claim 4, wherein said two low-voltage metal-oxide-silicon transistors have equal pinch-off voltages.

8. The apparatus of claim 3, wherein said two low-voltage depletion mode devices are stacked.

9. The apparatus of claim 8, further comprising a merged structure integrating said two low-voltage depletion mode devices and a biasing arrangement.

10. The apparatus of claim 9, wherein said biasing arrangement comprises an element selected from the group consisting of resistors and avalanche diodes.

11. A method for transient blocking comprising:
 a) providing a transient blocking unit having at least one depletion mode n-channel 3-terminal network interconnected with at least one depletion mode p-channel 3-terminal network such that a transient alters a bias voltage $V_p$ of said depletion mode p-channel 3-terminal network and a bias voltage $V_n$ of said depletion mode n-channel 3-terminal network, whereby said depletion mode p-channel 3-terminal network and said depletion mode n-channel 3-terminal network mutually switch off to block said transient;
 b) including a set of low-voltage depletion mode field effect transistors connected in source-to-drain series in at least one of said at least one depletion mode n-channel 3-terminal network and said at least one depletion mode p-channel 3-terminal network.

12. The method of claim 11, wherein said set is included in said at least one depletion mode n-channel 3-terminal network.

13. The method of claim 12, wherein said set comprises two low-voltage depletion mode devices selected from the group consisting of field effect transistors and junction gate field effect transistors.

14. The apparatus of claim 13, further comprising stacking said two low-voltage depletion mode devices.

15. The method of claim 13, further comprising providing a bias to a gate of a first transistor of said two low-voltage depletion mode devices.

* * * * *